United States Patent
Kobayashi et al.

(10) Patent No.: US 7,189,293 B2
(45) Date of Patent: *Mar. 13, 2007

(54) METHOD OF PRODUCING ANNEALED WAFER AND ANNEALED WAFER

(75) Inventors: Norihiro Kobayashi, Gunma (JP); Masaro Tamatsuka, Gunma (JP); Takatoshi Nagoya, Gunma (JP); Wei Feig Qu, Gunma (JP); Hiroshi Takeno, Gunma (JP); Ken Aihara, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 374 days.

This patent is subject to a terminal disclaimer.

(21) Appl. No.: 10/482,099

(22) PCT Filed: Jun. 25, 2002

(86) PCT No.: PCT/JP02/06367

§ 371 (c)(1),
(2), (4) Date: Dec. 24, 2003

(87) PCT Pub. No.: WO03/003441

PCT Pub. Date: Jan. 9, 2003

(65) Prior Publication Data

US 2004/0231759 A1 Nov. 25, 2004

(30) Foreign Application Priority Data

Jun. 28, 2001 (JP) .............................. 2001-195994
Jan. 28, 2002 (JP) .............................. 2002-018584

(51) Int. Cl.
*C30B 33/02* (2006.01)

(52) U.S. Cl. ........................ 148/562; 117/3; 438/795
(58) Field of Classification Search ................ 148/562; 117/3, 13, 20; 438/795
See application file for complete search history.

(56) References Cited

U.S. PATENT DOCUMENTS 5,931,662 A * 8/1999 Adachi et al. ................. 432/6
6,548,886 B1 * 4/2003 Ikari et al. .................. 257/610
6,902,618 B2 * 6/2005 Iida ............................. 117/20

FOREIGN PATENT DOCUMENTS

JP      A 05-144761       6/1993

(Continued)

*Primary Examiner*—George P. Wyszomierski
(74) *Attorney, Agent, or Firm*—Oliff & Berridge, PLC (57) ABSTRACT

The present invention is a method of producing an annealed wafer wherein a silicon single crystal wafer having a diameter of 200 mm or more produced by the Czochralski (CZ) method is subjected to a high temperature heat treatment in an atmosphere of an argon gas, a hydrogen gas, or a mixture gas thereof at a temperature of 1100–1350° C. for 10–600 minutes, and before the high temperature heat treatmen, a pre-annealing is performed at a temperature less than the temperature of the high temperature heat treatment, so that the growth of slip dislocations is suppressed by growing oxide precipitates. Thereby, there is provided a method of producing an annealed wafer wherein the generation and growth of slip dislocations generated in a high temperature heat treatment are suppressed and the defect density in the wafer surface layer is lowered even in the case of a silicon single crystal wafer having a large diameter of 200 mm or more, and the annealed wafer.

23 Claims, 2 Drawing Sheets

FOREIGN PATENT DOCUMENTS

| | | |
|---|---|---|
| JP | A 07-45623 | 2/1995 |
| JP | A 09-190954 | 7/1997 |
| JP | A 10-223641 | 8/1998 |
| JP | A 10-303208 | 11/1998 |
| JP | A 11-147786 | 6/1999 |
| JP | A 11-157996 | 6/1999 |
| JP | A 11-322491 | 11/1999 |
| JP | A 2000-211995 | 8/2000 |
| JP | A 2000-277527 | 10/2000 |
| JP | A 2001-139396 | 5/2001 |

* cited by examiner

METHOD OF PRODUCING ANNEALED WAFER AND ANNEALED WAFER

TECHNICAL FIELD

The present invention relates to a method of producing an annealed wafer and an annealed wafer, particularly relates to a method of producing an annealed wafer and an annealed wafer wherein the generation of slip dislocations is lowered and the deflect density on a wafer surface layer is lowered even in the case of a wafer having a large diameter.

BACKGROUND ART

Recently, high integration and fineness have been promoted in a device process, and the integrity of a device active region in a surface layer and the improvement of gettering ability to capture impurities such as metals caused by increase of bulk micro defects (BMD) formed by oxide precipitates (oxygen precipitation nuclei) in a bulk have been required of a silicon wafer.

In response to these requirements, various approaches have been attempted. For example, in order to eliminate defects (mainly grown-in defects) on a wafer surface, it has been performed that a wafer obtained by the Czochralski method (CZ method) is subjected to a high temperature heat treatment in an atmosphere of an argon gas or a hydrogen gas, or a mixture gas atmosphere thereof at 1100–1350° C. for 10–600 minutes.

However, in the case that a silicon wafer having a large diameter of 200 mm or 300 mm or more is subjected to the high temperature heat treatment as described above, slip dislocations, which penetrate a wafer from its back side to the front, are remarkably generated. Such slip dislocations are grown further in a device process, they cause a failure in a device process, and they have been one of factors of lowering a yield.

Moreover, in the case that a silicon wafer having a large diameter of 300 mm or more is subjected to the high temperature heat treatment, as compared to the case that a silicon wafer having a diameter of 200 mm is subjected to the high temperature heat treatment, the generation of slip dislocations is remarkably increased, these slip dislocations have penetrated a annealed wafer from its back side to the front, and have been detected by a visual inspection or a particle counter. Namely, in the above heat treatment process, it was impossible to eliminate crystal defects in a wafer surface and suppress slip dislocations at the same time.

DISCLOSURE OF THE INVENTION

The present invention was accomplished in view of the problems mentioned above, and the object of the present invention is to provide a method of producing an annealed wafer wherein the generation and growth of slip dislocations generated in a high temperature heat treatment are suppressed and the defect density in the wafer surface layer is lowered even in the case of a silicon single crystal wafer having a large diameter of 200 mm or more, and to provide the annealed wafer.

In order to accomplish the above object, the present invention provides a method of producing an annealed wafer wherein a silicon single crystal wafer having a diameter of 200 mm or more produced by the Czochralski (CZ) method is subjected to a high temperature heat treatment in an atmosphere of an argon gas, a hydrogen gas, or a mixture gas thereof at a temperature of 1100–1350° C. for 10–600 minutes, and before the high temperature heat treatment, a pre-annealing is performed at a temperature less than the temperature of the high temperature heat treatment to suppress growth of slip dislocations by growing oxide precipitates.

As described above, the growth of slip dislocations can be suppressed by increase of each size of oxide precipitates. Therefore, before the silicon single crystal wafer is subjected to the high temperature heat treatment, a pre-annealing is performed at a temperature less than the temperature of the high temperature heat treatment, and thereby, each size of oxide precipitates in the wafer can be grown largely. And then, by performing the high temperature heat treatment, the growth of slip dislocations during the high temperature heat treatment can be suppressed and crystal defects can be eliminated.

In this case, it is preferable that the pre-annealing is performed at least in a single stage for 2 hours or more.

As described above, the pre-annealing is performed at least in a single stage for 2 hours or more, and thereby, the growth of slip dislocations can be suppressed by surely growing oxide precipitates and the effect of lowering crystal defects in a wafer surface can be further enhanced.

In this case, it is preferable that a temperature range of the pre-annealing is 950–1050° C.

As described above, since a temperature range of the pre-annealing is 950 or more, oxide precipitates can be grown efficiently without taking along time, and since the temperature range is 1050° C. or less, oxide precipitates can be grown without growing slip dislocations in the pre-annealing. Moreover, since the pre-annealing is performed within such a temperature range, crystal defects in a wafer surface can be effectively lowered by the high temperature heat treatment.

And, in this case, it is preferable that the pre-annealing is performed in two stages of a first annealing (at a temperature T1) and a second annealing (at a temperature T2) having T1<T2.

As described above, when the pre-annealing is performed in two stages and the relation of each heat treatment temperature is T1<T2, each size of oxide precipitates can be grown to a certain degree by the first annealing, then the second annealing is performed at a temperature T2 higher than T1, and thereby, the growth of slip dislocations can be surely suppressed, and at the same time, oxide precipitates can be grown further in a relatively short period of time.

Moreover, in this case, it is preferable that the temperature T1 of the first annealing is 1000° C. and the temperature T2 of the second annealing is 1050° C.

As described above, if the temperature T1 of the first annealing is 1000° C., each size of oxide precipitates can be increased without growing slip dislocations, and since each size of oxide precipitates is grown to a certain degree by the first annealing of 1000° C., even in performing the second annealing of 1050° C., the growth of slip dislocations can be surely suppressed and oxide precipitates can be grown further in a relatively short period of time.

And, it is preferable that in the pre-annealing, when the silicon single crystal wafer is loaded into a heat treatment furnace, a temperature of the heat treatment furnace is controlled to be 700° C. or less, a wafer loading rate is controlled to be 50 mm/min or less, and a recovery temperature-rising rate is controlled to be 5° C./min or less.

Since a silicon single crystal wafer is loaded into a heat treatment furnace under the above described conditions, the generation of scratches on a wafer back side when loading a wafer, which is one of factors of the generation of slip dislocations, can be lowered, and thereby slip dislocations caused by starting from the scratches can be reduced.

And, it is preferable that a silicon single crystal wafer doped with nitrogen and having a nitrogen concentration of $1\times10^{13}$–$5\times10^{15}$/cm$^3$ and an oxygen concentration of 10–25 ppma (JEIDA) is used as the silicon single crystal wafer.

As described above, when the nitrogen concentration of the wafer is $1\times10^{13}$/cm$^3$ or more, the density of oxide precipitates ($1\times10^9$/cm$^3$ or more) to effectively suppress slip dislocations can be easily obtained, and when the nitrogen concentration is $5\times10^{15}$/cm$^3$ or less, a formation of a single crystal is not hindered when a CZ single crystal is pulled. And, when the oxygen concentration of the wafer is 10–25 ppma (JEIDA: Japan Electronic Industry Development Association Standard), a sufficient density of oxide precipitates can be obtained by the effect of nitrogen doping without generating slip dislocations originating from oxide precipitates.

Moreover, it is preferable that a silicon single crystal wafer which is produced under the condition that the generation of void defects is suppressed when a silicon single crystal is produced by the CZ method is used as the silicon single crystal wafer to be subjected to the high temperature heat treatment.

As described above, if a wafer which is produced under the condition that the generation of void defects is suppressed when a silicon single crystal is produced by the CZ method is used as the silicon single crystal wafer, in addition to the effect that the growth of slip dislocations can be suppressed during a high temperature heat treatment, since the wafer essentially having extremely few void defects is subjected to the high temperature heat treatment and oxide precipitates near its surface are almost annihilated by outdiffusion in the high temperature heat treatment, an extremely high quality DZ layer can be obtained.

In this case, it is preferable that an OSF density of the silicon single crystal wafer produced under the condition that the generation of void defects is suppressed is 1000 numbers/cm$^2$ or less.

As described above, if the silicon single crystal wafer is a wafer in which the OSF density observed after performing the thermal oxidation treatment is 1000 numbers/cm$^2$ or less, OSF nuclei existing near a wafer surface can be surely annihilated by the high temperature heat treatment.

And according to the present invention, there can be provided an annealed wafer having a large diameter wherein the growth of slip dislocations can be suppressed even if the wafer is subjected to the high temperature heat treatment and the defect density near a wafer surface is lowered.

As explained above, according to the present invention, when the high temperature heat treatment of 1100° C. or more is performed, the pre-annealing is performed at the temperature less than that of the high temperature heat treatment, and thereby, even in the case that a silicon single crystal wafer has a large diameter of 200 mm or more, an annealed wafer wherein the defect density in the wafer surface is small and slip dislocations are lowered can be provided.

BEST MODE FOR CARRYING OUT THE INVENTION

Hereinafter, embodiments of the present invention will be explained. However, the present invention is not limited thereto.

Conventionally, in a high temperature annealing performed by using an argon gas, a hydrogen gas or the like at a high temperature (1100–1350° C.) for a long time, in order not to contain slip dislocations in a wafer, after a wafer is loaded into a heat treatment furnace at a low temperature, the temperature is gradually increased to a designated heat treatment temperature. In this high temperature heat treatment, the reason why the heat treatment temperature is 1100° C. or more is to effectively eliminate defects near a wafer surface, and the reason why the heat treatment temperature is 1350° C. or less is to prevent problems such as deformation of the wafer, metal contamination, etc. However, such a conventional method has a problem that in the case that a wafer having a diameter of 200 mm or 300 mm or more is subjected to the heat treatment, when its temperature is a high temperature of over 1050° C., slip dislocations, which penetrate a wafer from its back side to the front, are remarkably generated.

One of the causes is that when a silicon wafer is loaded into a heat treatment furnace, a temperature distribution in a surface of the silicon wafer is enlarged. And thereby, the wafer itself is deformed, so that a part of a contact portion of the wafer with a boat is broken, and scratches are generated on the wafer back side. After that, by subjecting the silicon wafer to a high temperature heat treatment, slip dislocations are grown starting from the scratches on the wafer back side and they penetrate the wafer to its front side.

Accordingly, inventors of the present invention has conceived that in order to lower crystal defects in a wafer surface and to suppress the generation and the growth of slip dislocations, if the generation of scratches on a wafer back side can be reduced when a wafer is loaded into a furnace and if, before performing a heat treatment at a temperature of 1100° C. or higher, oxide precipitates, which have the effect of suppressing the growth of slip dislocations, can be grown to a certain size or more under the condition that slip dislocations are not generated nor grown, crystal defects in a wafer surface can be eliminated and slip dislocations of an annealed wafer can be lowered. And they accomplished the present invention by assiduous studies and investigations.

Namely, before a mirror-polished wafer, which is sliced from a single crystal ingot grown by the CZ method and polished, is subjected to a high temperature heat treat in an atmosphere of an argon gas, a hydrogen gas, or a mixture gas thereof at a temperature of 1100–1350° C. for 10–600 minutes, the wafer is firstly subjected to a pre-annealing at a temperature less than the temperature of the high temperature heat treatment under the condition that slip dislocations are not generated to grow oxide precipitates in the wafer. After that, by performing the high temperature heat treatment, a wafer such that crystal defects on and near the wafer surface are eliminated and a gettering layer by oxygen precipitation exists inside the wafer can be produced without growing slip dislocations.

Particularly, when the pre-annealing is performed at least in a single stage for 2 hours or more, and then the high temperature heat treatment is performed, the generation of slip dislocations can be surely suppressed and the effect of lowering crystal defects can be further enhanced.

Additionally, it is possible that the pre-annealing and the high temperature heat treatment (defect eliminating annealing) of 1100° C. or higher is continuously performed without unloading a wafer from a furnace, or it is possible that after the pre-annealing, the temperature is once lowered and a wafer is unloaded from a furnace, and then the wafer is loaded into the heat treatment furnace again and a defect eliminating annealing is performed. In consideration of productivity, it is preferable to continuously perform the processes.

In this case, if the temperature of the pre-annealing is less than 950° C., it takes a long time to grow oxide precipitates, which is not efficiently. And if the temperature of the pre-annealing is over 1050° C., slip dislocations are remarkably generated. And therefore, it is preferable that the temperature range of the pre-annealing is 950–1050° C.

Moreover, it is preferable that the pre-annealing is performed in two stages. First, each size of oxide precipitates existing in a wafer is grown to a certain degree in the first annealing (at a temperature T1), and then the second annealing is performed at a temperature T2 higher than T1, and thereby, the growth of slip dislocations in the second annealing can be surely suppressed, and at the same time, oxide precipitates can be grown further in a short period of time, so that the growth of slip dislocations in a subsequent high temperature heat treatment of 1100° C. or more can be sufficiently suppressed, and crystal defects of an annealed wafer can be further lowered after the high temperature heat treatment.

In this case, there is the possibility that if the heat treatment temperature is 1000° C., although slip dislocations are not grown, it may take a long time to grow oxide precipitates, and if the heat treatment temperature is 1050° C., oxide precipitates and slip dislocations may be grown at the same time. Accordingly, when the heat treatment temperature of the first annealing is set at 1000° C. and the heat treatment temperature of the second annealing is set at 1050° C., oxide precipitates can be grown without growing slip dislocations in the first annealing to the size that slip dislocations is not grown in the second annealing, after that, by growing oxide precipitates further in the second annealing, oxide precipitates can be grown in a short period of time, and crystal defects can be eliminated without growing slip dislocations even in the high temperature heat treatment of 1100° C. or more. Therefore, when the temperature T1 of the first annealing is 1000° C. and the temperature T2 of the second annealing is 1050° C. as described above, slip dislocations can be efficiently suppressed, oxide precipitates can be grown in a short period of time, and the defect density of the annealed wafer can be lowered.

And, slip dislocations, which penetrate a wafer to its front side, are caused by two factors of generation of scratches on a wafer back side when loading a wafer into a furnace and the growth by a subsequent heat treatment, as aforementioned. Conditions of scratches generated on a wafer back side vary by changing wafer loading conditions. Also, if many scratches are generated on a wafer back side when loading a wafer into a furnace, slip dislocations are grown starting from the scratches. Accordingly, when a wafer is loaded into a heat treatment furnace in the pre-annealing, a temperature of the heat treatment furnace is controlled to be 700° C. or less, a wafer loading rate is controlled to be 50 mm/min or less, and a recovery temperature-rising rate is controlled to be 5° C./min or less, and thereby, the generation of scratches on a wafer back side can be lowered when loading a wafer, and the growth of slip dislocations can be prevented thereafter. Particularly, if the wafer loading temperature is over 700° C., the larger the diameter of a wafer is, the larger the temperature distribution in a wafer becomes when loading a wafer, so that the wafer is greatly deformed. As a result, the friction between the wafer and a boat is increased and sources of generation of slip dislocations are increased. Therefore, it is preferable that the wafer loading temperature is 700° C. or less.

Additionally, the term a recovery temperature-rising rate used herein is the temperature-rising rate to recover the furnace temperature from the lowered value to the prescribed value in the case that when a wafer is loaded into a heat treatment furnace of which temperature is set at a prescribed temperature, the temperature in the furnace is lowered less than the prescribed temperature.

Moreover, it is preferable that the wafer used in the present invention is a silicon single crystal wafer doped with nitrogen. If the wafer is a silicon single crystal wafer doped with nitrogen and having a nitrogen concentration of $1 \times 10^{13}/cm^3$ or more, the density of oxide precipitates ($1 \times 10^9/cm^3$ or more), which is effective in suppressing slip dislocations, can be easily obtained. However, if a nitrogen concentration is over $5 \times 10^{15}/cm^3$, there is a possibility that formation of a single crystal is prevented when pulling a CZ single crystal, which causes decrease of productivity. Therefore, it is preferable that the nitrogen concentration of the wafer is $1 \times 10^{13} - 5 \times 10^{15}/cm^3$ Also, in this case, if the oxygen concentration of the wafer is 10 ppma (JEIDA) or more, a sufficient density of oxygen precipitates can be obtained by the effect of nitrogen doping. However, on the contrary, if the oxygen concentration exceeds 25 ppma, oxide precipitation is too much, and slip dislocations caused by the precipitates are easy to be newly generated. Accordingly, it is preferable that the oxygen concentration of the wafer is 10–25 ppma (JEIDA).

Furthermore, in the present invention, it is preferable that a silicon single crystal wafer produced under the condition that the generation of void defects is suppressed when a silicon single crystal is produced by the CZ method is used as the silicon single crystal wafer to be subjected to the high temperature heat treatment. At this point, as for the condition that the generation of void defects is suppressed, as described in the Japanese patent Laid-open applications Nos. 11-147786, 11-157996, etc., for example, there can be provided a condition that a silicon single crystal is pulled in a N-region (neutral region) in which the generation of defects such as void defects which are agglomeration of vacancy type point defects and dislocations caused by excessive interstitial silicons is suppressed by controlling a V/G value which is a ratio of a pulling rate V and a temperature gradient G near a solid-liquid interface in a pulling crystal when a silicon single crystal is pulled by the CZ method. Specifically, the V/G is controlled by adjusting a furnace structure (hot zone structure) in a pulling apparatus and a pulling rate, and thereby, the growth of the silicon single crystal can be performed under the condition to be a N-region, so that the crystal having no void defects serving as the agglomeration of vacancy type point defects can be obtained.

By subjecting the silicon single crystal wafer produced under such a condition to the high temperature heat treatment of the present invention, in addition to the effect that the growth of slip dislocations in the high temperature heat treatment can be suppressed, the wafer inherently having extremely few void defects is subjected to the high temperature heat treatment and oxygen precipitates near the surface are almost annihilated by out-diffusion in the high temperature heat treatment, so that an annealed wafer having an extremely high quality DZ layer can be obtained.

In this case, it is preferable that the silicon single crystal wafer produced under the condition that the generation of void defects is suppressed is a wafer in which the OSF density detected on its surface by performing a high temperature oxidation heat treatment is 1000 numbers/cm² or less. OSF nuclei causing the generation of OSF by a high temperature thermal oxidation are Grown-in oxide precipitates having a comparatively large size, and if such OSF nuclei exist near a wafer surface in high density, OSF nuclei may not be annihilated sufficiently by out-diffusion even in the high temperature heat treatment of the present invention and remain therein. However, if the OSF density of a silicon single crystal wafer is 1000 numbers/cm² or less, OSF nuclei existing near a wafer surface can be surely annihilated by the out-diffusion in the high temperature heat treatment.

Hereinafter, the present invention will be further explained in detail.

First, an ingot containing nitrogen of $5 \times 10^{13}$/cm³ (calculated value) and oxygen of 15 ppma (JEIDA), and having a diameter of 300 mm were grown by the MCZ method, and then wafers were prepared by slicing them from the ingot.

After that, in order that prepared wafers were subjected to a heat treatment, the wafers were loaded into a heat treatment furnace. Wafer loading conditions at that time were set as follows. The temperature of the heat treatment furnace was 700° C., the wafer loading rate was 100 mm/min, and the recovery temperature-rising rate was 10° C./min.

Figure 1:
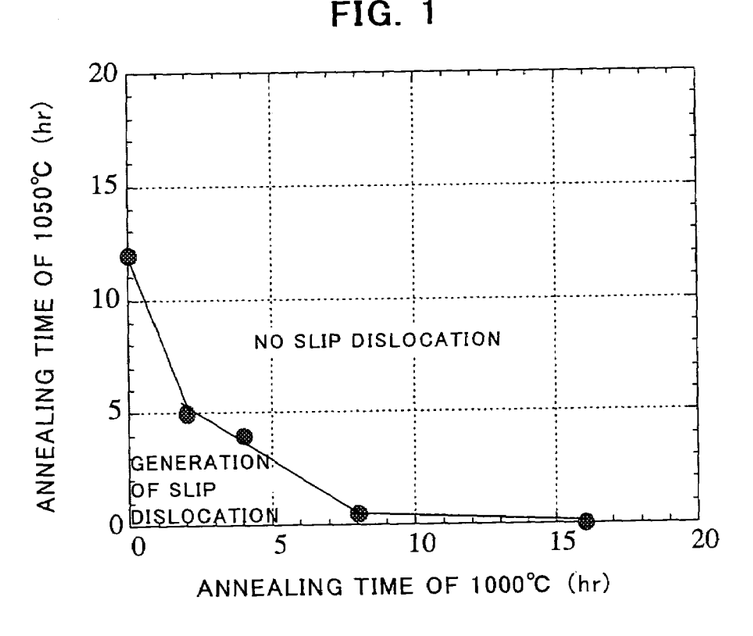
FIG. 1 is a diagram showing the existence of slip dislocations on each annealed wafer surface when each heat treatment time of the first annealing (1000° C.) and the second annealing (1050° C.) is changed.

After the wafers were loaded into the furnace, a pre-annealing was performed in an atmosphere of Ar at 1000° C. for 0–16 hours+at 1050° C. for 0–12 hours, and then, a high temperature heat treatment was preformed at 1200° C. for 1 hour. After the annealing, the existence of slip dislocations existing on each surface of the annealed wafers obtained from each heat treatment condition was inspected. These results are shown in FIG. 1. Each plot and straight lines connecting them in FIG. 1 are a borderline which indicates whether slip dislocations are generated or not by the high temperature heat treatment (at 1200° C. for 1 hour), and it means that slip dislocations are generated below the borderline and slip dislocations are not generated on or above the borderline (additionally, in the case that the pre-annealing was not performed but only the high temperature heat treatment was performed at 1200° C. for 1 hour, slip dislocations were frequently generated).

Figure 3:
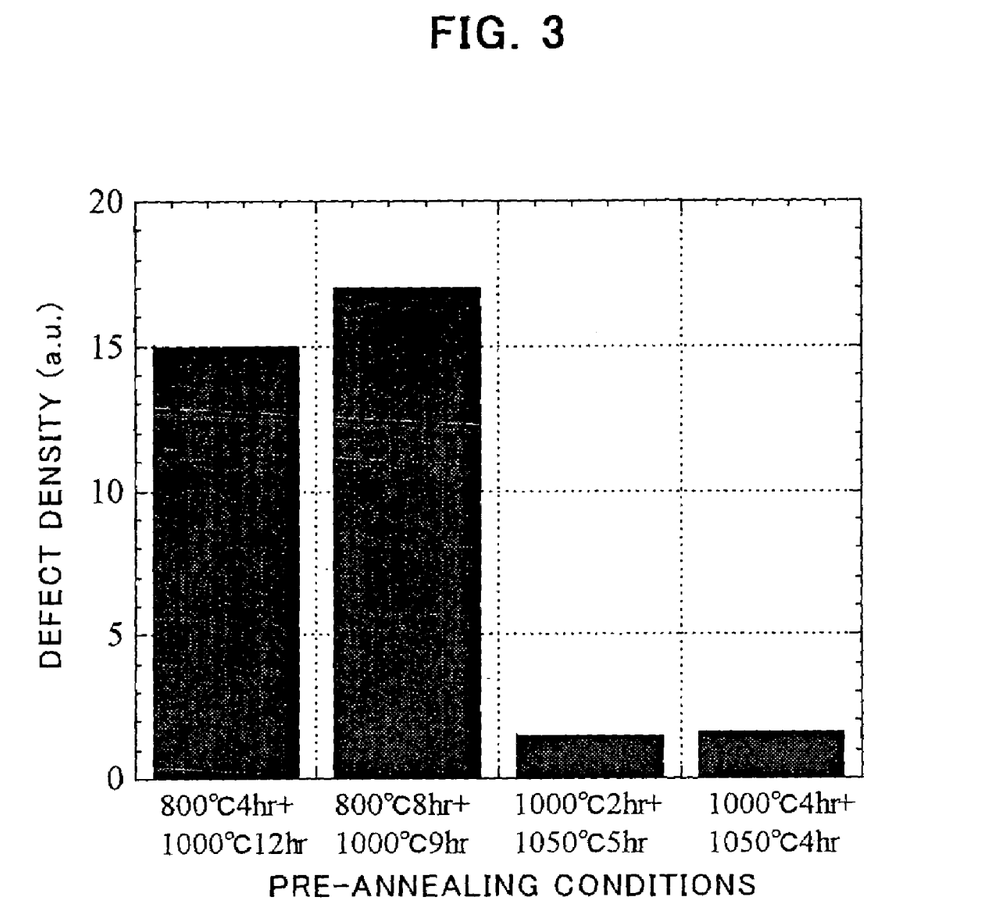
FIG. 3 is a diagram showing comparisons of measured crystal defect densities of each surface of annealed wafers under different pre-annealing conditions.

Also, defect densities of each surface of the annealed wafers obtained under the heat treatment condition of at 1000° C. for 2 hours+at 1050° C. for 5 hours+at 1200° C. for 1 hour, and the heat treatment condition of at 1000° C. for 4 hours+at 1050° C. for 4 hours+at 1200° C. for 1 hour (each condition is that slip dislocations are not generated) were measured and these results are shown in FIG. 3.

As shown in FIG. 1, by properly setting the temperature and time of the pre-annealing before the high temperature heat treatment of 1200° C., annealed wafers having no slip dislocation on the surface thereof can be obtained, and among them, the wafers annealed under the heat treatment condition of at 1000° C. for 2 hours+at 1050° C. for 5 hours+at 1200° C. for 1 hour and the heat treatment condition of at 1000° C. for 4 hours+at 1050° C. for 4 hours+at 1200° C. for 1 hour, became the annealed wafers having no slip dislocation which were obtained by the comparatively short-time pre-annealing. Also, the annealed wafers produced by these two conditions have extremely few surface defects as shown in FIG. 3.

Figure 2:
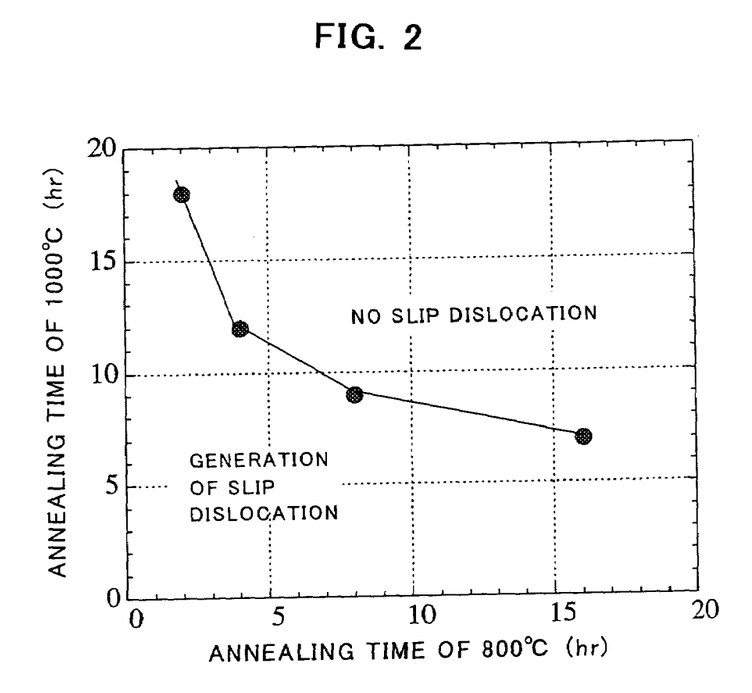
FIG. 2 is a diagram showing the existence of slip dislocations on each annealed wafer surface when each heat treatment time of the first annealing (800° C.) and the second annealing (1000° C.) is changed.

Next, by means of the MCZ method, wafers were prepared under the same conditions as in the above, and they were loaded into the heat treatment furnace under the same wafer loading conditions as in the above. After that, a pre-annealing was performed in an atmosphere of Ar at 800° C. for 2–16 hours+at 1000° C. for 7–18 hours, and then a high temperature heat treatment was performed at 1200° C. for 1 hour. After the annealings, the existence of slip dislocations existing on each surface of the annealed wafers obtained under each heat treatment condition was inspected. These results are shown in FIG. 2 (The way of looking at FIG. 2 is the same as FIG. 1). Also, defect densities of each surface of annealed wafers obtained under the heat treatment condition of at 800° C. for 4 hours+at 1000° C. for 12 hours+at 1200° C. for 1 hour, and the heat treatment condition of at 800° C. for 8 hours+at 1000° C. for 9 hours+at 1200° C. for 1 hour were measured and these results are shown in FIG. 3.

As shown in FIG. 2, by properly setting the temperature and time of the pre-annealing, the annealed wafers having no slip dislocation on the surface thereof can be obtained, and among them, the wafer annealed under the heat treatment condition of at 800° C. for 4 hours+at 1000° C. for 12 hours+at 1200° C. for 1 hour can be the annealed wafer having no slip dislocation which was obtained by the comparatively short-time annealing.

From the results of FIGS. 1 and 2, it is found that in the case of considering the heat treatment time, when the oxygen precipitation treatment is performed by a pre-annealing having the combination of 1000° C.+1050° C., the annealed wafer having no slip dislocation can be efficiently obtained in a shorter time compared to a pre-annealing having the combination of 800° C.+1000° C.

Also, as shown in FIG. 3, in the above pre-annealing having the combination of 1000° C.+1050° C. or 800° C.+1000° C., as compared to defect densities on each surface layer of annealed wafers obtained under the heat treatment conditions of a comparatively short time among heat treatment conditions which can eliminate slip dislocations on each wafer surface, the defect density of the annealed wafer subjected to the heat treatment having the combination of 800° C.+1000° C.+1200° C. is about 5–10 times higher than that of the annealed wafer subjected to the heat treatment having the combination of 1000° C.+1050° C.+1200° C. Therefore, it was found that elimination of crystal defects in the high temperature heat treatment was suppressed in the wafer subjected to the heat treatment having the combination of 800° C.+1000° C.+1200° C. Although the reason is not clear, when the heat treatment of the combination of 800° C.+1000° C.+1200° C. is performed, it is considered that in the pre-annealing of 800° C.+1000° C., defects which are difficult to be eliminated by the argon annealing of 1200° C. are grown.

From these results, it is also found that the density of crystal defects in a surface layer of the wafer can be much lowered by performing the pre-annealing having the combination of 1000° C.+1050° C., which is more effective.

Next, heat treatments were performed with different wafer loading conditions in the pre-annealing.

First, an ingot containing nitrogen of $5 \times 10^{13}$ atoms/cm³ (calculated value) and oxygen of 15 ppma (JEIDA), and having a diameter of 300 mm was grown by the MCZ method, and then, wafers were prepared by slicing them from the ingot.

After that, in order that prepared wafers were subjected to a heat treatment, the wafers were loaded into a heat treatment furnace. The wafer loading conditions into the heat treatment furnace at that time are shown in Table 1 as follows.

TABLE 1

| Wafer Loading Condition | Temperature of Heat Treatment Furnace | Wafer Loading Rate | Recovery Temperature-rising Rate |
| --- | --- | --- | --- |
| Condition 1 | 700° C. | 100 mm/min | 10° C./min |
| Condition 2 | 700° C. | 100 mm/min | 5° C./min |
| Condition 3 | 700° C. | 50 mm/min | 10° C./min |
| Condition 4 | 700° C. | 50 mm/min | 5° C./min |

After wafers were loaded into the heat treatment furnace under each wafer loading conditions, a pre-annealing was performed at 1000° C. for 2–8 hours+at 1050° C. for 2–8 hours, and then a high temperature heat treatment was performed at 1200° C. for 1 hour.

As a result, when the wafer loading conditions were conditions 1–3, by performing the annealing under the heat treatment condition of at 1000° C. for 4 hours+at 1050° C. for 4 hours+at 1200° C. for 1 hour as in the results of FIG. 1, crystal defects could be lowered and slip dislocations that penetrate the annealed wafer to the front side were not generated. On the other hand, only when wafers were loaded into the heat treatment furnace under the condition 4, even by the annealing under the heat treatment condition of at 1000° C. for 2 hours+at 1050° C. for 2 hours+at 1200° C. for 1 hour, i.e., the short time pre-annealing which shows results that slip dislocations were generated in FIG. 1, the annealed wafer with low defect density having no slip dislocation which penetrate the wafer to its front side could be obtained.

From the above results, when the wafer loading condition is a condition in which the temperature of the heat treatment furnace is 700° C., the wafer loading rate is 50 mm/min, and the recovery temperature-rising rate is 5° C./min, or a condition such that less load is applied to the wafer than the above condition (700° C. or less, 50 mm/min or less, and 5° C./min or less, respectively), growth of slip dislocations can be effectively suppressed.

Also, for confirmation, wafers were loaded into a heat treatment furnace under the conditions 1–4, and then annealed wafers which were subjected to the high temperature heat treatment at 1200° C. for 1 hour without performing a pre-annealing and annealed wafers which were subjected to the pre-annealing at 1000° C. for 2 hours and then subjected to the high temperature heat treatment at 1200° C. for 1 hour were prepared, after that, they were compared by measuring density of crystal defects and slip dislocations generated. As a result, as for the annealed wafer without a pre-annealing, slip dislocations possible to be observed even by a visual inspection were remarkably generated in any case without depending on the wafer loading conditions. However, as for the annealed wafers subjected to the pre-annealing, the defect density and slip dislocations generated were lowered not more than half of that of the annealed wafer without a pre-annealing.

Namely, according to the present invention, by performing a pre-annealing at the temperature less than the temperature of the high temperature heat treatment before the high temperature heat treatment, the density of crystal defects of the annealed wafer can be surely lowered, and at the same time, the generation of slip dislocations can be suppressed. In particular, as in the case that the pre-annealing is performed in two stages, the annealed wafer having no slip dislocation at all can also be produced.

The present invention will be explained more specifically as described in the examples and comparative examples below, but the present invention is not limited thereto.

EXAMPLE 1

First, raw material polycrystalline silicon was charged into a quartz crucible, a silicon wafer with a nitride film was charged thereinto beforehand, and a silicon single crystal having a diameter of 300 mm, P-type, orientation <100>, and doped with nitrogen was grown by the MCZ method (content of nitrogen was $5 \times 10^{13}$ atoms/cm$^3$ (calculated value) and content of oxygen was 15 ppma (JEIDA)). After that, the single crystal was sliced into a wafer, and the wafer was subjected to lapping, chamfering and polishing to be a mirror-polished wafer.

Next, in order to anneal the mirror-polished wafer obtained, the wafer was loaded into a heat treatment furnace. At that time, as for the loading condition of the wafer, the temperature of the heat treatment furnace was set at 700° C., the wafer loading rate was set at 50 mm/min, and the recovery temperature-rising rate was set at 5° C./min.

After the wafer was loaded into the heat treatment furnace, in an atmosphere of 100% Ar, a first annealing was performed at 1000° C. for 2 hours, then a second annealing was performed at 1050° C. for 2 hours, followed by performing a high temperature heat treatment at 1200° C. for 1 hour.

After the high temperature heat treatment, a surface of the annealed wafer was observed by X-ray topography and a surface inspection apparatus (SP-1, made by KLA-Tencor Corporation.), and as a result, slip dislocation were not almost detected. And the defect density of the surface of the annealed wafer obtained was measured by a defect evaluation apparatus (MO-601, made by Mitsui Mining and Smelting Co., Ltd.), and as a result, a very low value of 1.5 numbers/cm$^2$ was shown.

Also, by using a wafer of the same specifications as the above wafer, densities of oxide precipitates and sizes of oxide precipitates were measured by an OPP (Optical Precipitate Profiler) made by High Yield Technology, which is infrared interferometric defect evaluation apparatus, in each case of before and after the first annealing, and after the second annealing.

As a result, since each size of oxide precipitates before the first annealing was small, they could not be observed by the OPP. For your information, the lower limit of the size of oxygen precipitates possible to be inspected by the OPP is about 50 nm. On the other hand, after the first annealing, the oxide precipitates were grown to a size possible to be inspected, which were 1.2 (a.u.) on the average. Moreover, it was found that after the second annealing, they were grown to 2.8 (a.u.) on the average. And the densities of oxide precipitates of both of after the first annealing and after the second annealing were $4 \times 10^9$ numbers/cm$^3$.

Namely, it is presumed that since the size of oxide precipitates are grown by the first and second annealings and the oxide precipitates were formed at the sufficient density as described above, the generation of slip dislocations caused by the subsequent high temperature heat treatment was suppressed.

In addition, since the above OPP can not measure an absolute value of the defect size detected, the estimation was performed by a relative value using a.u. (arbitrary unit).

EXAMPLES 2–8 AND COMPARATIVE EXAMPLES 1 AND 2

First, raw material polycrystalline silicon was charged into a quartz crucible, a silicon wafer with a nitride film was charged thereinto beforehand, and a silicon single crystal ingot having a diameter of 200 mm, crystal orientation <100>, P-type, and doped with nitrogen of 10 Ω·cm was grown by the CZ method (content of nitrogen was $5 \times 10^{13}$ atoms/cm$^3$ (calculated value) and content of oxygen was 15 ppma (JEIDA)). After that, the silicon single crystal ingot was sliced into wafers, and the wafers were subjected to lapping, chamfering and polishing to prepare mirror-polished wafers. The defect density of each surface of these mirror-polished wafers was measured by MO-601 (made by Mitsui Mining and Smelting Co., Ltd.), and as a result, the defect density was 55.3 numbers/cm$^2$.

The mirror-polished wafers manufactured as described above were continuously subjected to the heat treatments in an atmosphere of 100% Ar under each heat treatment condition described in Table 2 as follows by using a vertical type heat treatment furnace. In addition, at that time, each condition of loading and unloading wafers was as follows. That is, the temperature of the heat treatment furnace was set at 700° C., the boat speed (wafer loading rate) was set at 50 mm/min, the recovery temperature-rising rate was set at 5° C./min, and after loading the wafers into the heat treatment furnace, the temperature of the heat treatment furnace was increased at the temperature-rising rate of 5° C./min. After the high temperature heat treatment, the defect density of each surface of the annealed wafers manufactured was measured by using MO-601 (made by Mitsui Mining and Smelting Co., Ltd.) and the generation condition of slip dislocations was observed by an X-ray topograph image. And, a 5-stage relative evaluation was performed in a way that the wafer in which slip dislocations were not almost generated was ranked as 1 and the wafer in which slip dislocations were generated the most was ranked as 5. These measured results are shown together in Table 2 as follows.

As shown in Table 2 described above, by subjecting to a pre-annealing in a single stage for 2 hours or more before the high temperature heat treatment, in particular, by subjecting to a pre-annealing within the temperature range of 950–1050° C. (Examples 2–4), the generation of slip dislocations could be suppressed and the density of crystal defects other than slip dislocations could also be surely lowered. Further, when the pre-annealing time was longer (Examples 5–8), the generation of slip dislocations could be further suppressed, and the effect of eliminating crystal defects could also be further enhanced. However, in the case that the pre-annealing was not performed before the high temperature heat treatment (Comparative Examples 1 and 2), slip dislocations were remarkably generated on each surface of the annealed wafers, i.e., the generation of slip dislocations could not be suppressed. Also, it was found that as to the annealed wafers subjected to the pre-annealing according to the present invention, not only slip dislocations could be reduced, but also the effect of eliminating crystal defects could be increased as compared to the conventional case that only a high temperature heat treatment is performed.

Moreover, it was confirmed that even if the experiment is repeatedly performed under the same conditions as above, the same results as the Table 2 can be obtained, i.e., it is reproducible.

EXAMPLE 9

First, raw material polycrystalline silicon was charged into a quartz crucible, and a silicon single crystal having a diameter of 200 mm, P-type and orientation <100> was grown under the condition that a cross section perpendicular to a growing direction of the crystal becomes a N-region for an entire plane by controlling a V/G value according to the MCZ method (nitrogen was not doped and content of oxygen was 15 ppma (JEIDA)). After that, the single crystal was sliced into wafers, and the wafers were subjected to lapping, chamfering and polishing to be mirror-polished wafers.

In order to measure the OSF density of the surface of the wafer, one wafer was sampled. And, the wafer was subjected to a heat treatment at 1000° C. for 3 hours+at 1150° C. for 100 minutes in an oxidizing atmosphere, then its surface was

TABLE 2

| | Pre-Annealing | | High Temperature Heat Treatment | | Defect Density (numbers/cm$^2$) | Generation Condition Of Slip Dislocation (Rank) |
|---|---|---|---|---|---|---|
| | Temperature (° C.) | Hour (hr) | Temperature (° C.) | Hour (hr) | | |
| Example 2 | 950 | 4 | 1200 | 1 | 1.1 | 1 |
| Example 3 | 1000 | 4 | 1200 | 1 | 1.0 | 2 |
| Example 4 | 1050 | 4 | 1200 | 1 | 1.2 | 3 |
| Example 5 | 1000 | 2 | 1200 | 1 | 1.3 | 3 |
| Example 6 | 1000 | 4 | 1200 | 1 | 1.0 | 2 |
| Example 7 | 1000 | 8 | 1200 | 1 | 0.8 | 2 |
| Example 8 | 1000 | 16 | 1200 | 1 | 0.5 | 1 |
| Comparative Example 1 | None | | 1200 | 1 | 2.6 | 5 |
| Comparative Example 2 | None | | 1200 | 4 | 1.3 | 5 | subjected to preferential etching to observe its OSF density. As a result, it was confirmed that about 150 numbers/cm² of the OSF was observed and the OSF density of the mirror-polished wafer manufactured was 1000 numbers/cm² or less.

Next, the mirror-polished wafer manufactured was subjected to the heat treatment in an atmosphere of 100% Ar under the heat treatment conditions described in Example 2 of Table 2 by using a vertical type heat treatment furnace. At that moment, loading conditions of the wafer were as follows. That is, the temperature of the heat treatment furnace was set at 700° C., the wafer loading rate was set at 50 mm/min, the recovery temperature-rising rate was set at 5° C./min. And after the wafer was-loaded into the heat treatment furnace, the temperature of the heat treatment furnace was increased at the temperature-rising rate of 5° C./min.

After the high temperature heat treatment, the surface of the annealed wafer was measured by X-ray topography and a surface inspection apparatus (SP-1, made by KLA-Tencor Corporation), and as a result, slip dislocation were not almost confirmed (which is an equal level to the rank 1 in Table 2).

Also, the defect density of the surface of the annealed wafer obtained was measured by a defect evaluation apparatus (MO-601, made by Mitsui Mining and Smelting Co., Ltd.), and as a result, a very low value of 0.05 numbers/cm² was shown.

Moreover, using the wafers having the same specifications as the above wafer, each density of oxide precipitates and sizes of oxide precipitates were measured by the OPP in each case of before the pre-annealing and after the high temperature heat treatment.

As a result, since the size of oxide precipitates before the pre-annealing was small, they could not be observed by the OPP. On the other hand, oxide precipitates after the high temperature heat treatment were grown to a size possible to be inspected by the OPP, which were 2.5 (a.u.) on the average. And the density of oxide precipitates was $5 \times 10^9$ numbers/cm³.

The present invention is not limited to the embodiment described above. The above-described embodiment is a mere example, and those having substantially the same structure as that described in the appended claims and providing the similar functions and advantages are included in the scope of the present invention.

For example, in the above Examples, the case that the atmosphere for the high temperature heat treatment is argon is taken as an example, but the case that the high temperature heat treatment is performed in an atmosphere of hydrogen or a mixture atmosphere of hydrogen and argon can also be applied the present invention to in the same way. And if a temperature of a high temperature heat treatment and a heat treatment time is within the range of the present invention, the present invention can be applied thereto in the same way.

The invention claimed is:

1. A method of producing an annealed wafer wherein a silicon single crystal wafer having a diameter of 200 mm or more produced by the Czochralski (CZ) method is subjected to a high temperature heat treatment in an atmosphere of an argon gas, a hydrogen gas, or a mixture gas thereof at 1100–1350° C. for 10–600 minutes, and before the high temperature heat treatment, a pre-annealing is performed by maintaining the wafer for a period of time at a temperature less than the temperature of the high temperature heat treatment wherein the period of time is sufficient to suppress growth of slip dislocations by growing oxide precipitates.

2. The method of producing an annealed wafer according to claim 1, wherein the pre-annealing is performed at least in a single stage for 2 hours or more.

3. The method of producing an annealed wafer according to claim 2, wherein a temperature range of the pre-annealing is 950–1050° C.

4. The method of producing an annealed wafer according to claim 3, wherein the pre-annealing is performed in two stages of a first annealing (at a temperature T1) and a second annealing (at a temperature T2) having T1<T2.

5. The method of producing an annealed wafer according to claim 4, wherein the temperature T1 of the first annealing is 1000° C. and the temperature T2 of the second annealing is 1050° C.

6. The method of producing an annealed wafer according to claim 2, wherein the pre-annealing is performed in two stages of a first annealing (at a temperature T1) and a second annealing (at a temperature T2) having T1<T2.

7. The method of producing an annealed wafer according to claim 6, wherein the temperature T1 of the first annealing is 1000° C. and the temperature T2 of the second annealing is 1050° C.

8. The method of producing an annealed wafer according to claim 1, wherein a temperature range of the pre-annealing is 950–1050° C.

9. The method of producing an annealed wafer according to claim 8, wherein the pre-annealing is performed in two stages of a first annealing (at a temperature T1) and a second annealing (at a temperature T2) having T1<T2.

10. The method of producing an annealed wafer according to claim 9, wherein the temperature T1 of the first annealing is 1000° C. and the temperature T2 of the second annealing is 1050° C.

11. The method of producing an annealed wafer according to claim 9, wherein a silicon single crystal wafer doped with nitrogen and having a nitrogen concentration of $1 \times 10^{13}$–$5 \times 10^{15}$/cm³ and oxygen concentration of 10–25 ppma (JEIDA) is used as the silicon single crystal wafer.

12. The method of producing an annealed wafer according to claim 9, wherein a silicon single crystal wafer which is produced under a condition that generation of void defects is suppressed when a silicon single crystal is produced by the CZ method is used as the silicon single crystal wafer to be subjected to the high temperature heat treatment.

13. The method of producing an annealed wafer according to claim 8, wherein a silicon single crystal wafer doped with nitrogen and having a nitrogen concentration of $1 \times 10^{13}$–$5 \times 10^{15}$/cm³ and oxygen concentration of 10–25 ppma (JEIDA) is used as the silicon single crystal wafer.

14. The method of producing an annealed wafer according to claim 8, wherein a silicon single crystal wafer which is produced under a condition that generation of void defects is suppressed when a silicon single crystal is produced by the CZ method is used as the silicon single crystal wafer to be subjected to the high temperature heat treatment.

15. The method of producing an annealed wafer according to claim 14, wherein an OSF density of the silicon single crystal wafer produced under the condition that generation of void defects is suppressed is 1000 numbers/cm² or less.

16. The method of producing an annealed wafer according to claim 1, wherein the pre-annealing is performed in two stages of a first annealing (at a temperature T1) and a second annealing (at a temperature T2) having T1<T2.

17. The method of producing an annealed wafer according to claim 16, wherein the temperature T1 of the first annealing is 1000° C. and the temperature T2 of the second annealing is 1050° C.

18. The method of producing an annealed wafer according to claim 16, wherein a silicon single crystal wafer doped with nitrogen and having a nitrogen concentration of $1\times10^{13}$–$5\times10^{15}/cm^3$ and oxygen concentration of 10–25 ppma (JEIDA) is used as the silicon single crystal wafer.

19. The method of producing an annealed wafer according to claim 16, wherein a silicon single crystal wafer which is produced under a condition that generation of void defects is suppressed when a silicon single crystal is produced by the CZ method is used as the silicon single crystal wafer to be subjected to the high temperature heat treatment.

20. The method of producing an annealed wafer according to claim 1, wherein in the pre-annealing, when the silicon single crystal wafer is loaded into a heat treatment furnace, a temperature of the heat treatment furnace is controlled to be 700° C. or less, a wafer loading rate is controlled to be 50 mm/mm or less, and a recovery temperature-rising rate is controlled to be 5° C./mm or less.

21. The method of producing an annealed wafer according to claim 1, wherein a silicon single crystal wafer doped with nitrogen and having a nitrogen concentration of $1\times10^{13}$–$5\times10^{15}/cm^3$ and oxygen concentration of 10–25 ppma (JEIDA) is used as the silicon single crystal wafer.

22. The method of producing an annealed wafer according to claim 1, wherein a silicon single crystal wafer which is produced under a condition that generation of void defects is suppressed when a silicon single crystal is produced by the CZ method is used as the silicon single crystal wafer to be subjected to the high temperature heat treatment.

23. The method of producing an annealed wafer according to claim 22, wherein an OSF density of the silicon single crystal wafer produced under the condition that generation of void defects is suppressed is 1000 numbers/cm$^2$ or less.

* * * * *